(12) United States Patent
Chen

(10) Patent No.: US 10,620,498 B2
(45) Date of Patent: Apr. 14, 2020

(54) DISPLAY PANEL AND DISPLAY DEVICE WITH CONNECTING PORTION FORMED IN FAN-OUT REGION

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTROMICS TECHNOLOGY CO., LTD., Chongqing (CN)

( * ) Notice: Subject to any disclaimer, the term of this patent is extended or adjusted under 35 U.S.C. 154(b) by 157 days.

(21) Appl. No.: 15/869,654

(22) Filed: Jan. 12, 2018

(65) Prior Publication Data

US 2019/0049805 A1 Feb. 14, 2019

Related U.S. Application Data

(63) Continuation of application No. PCT/CN2017/099602, filed on Aug. 30, 2017.

(30) Foreign Application Priority Data

Aug. 8, 2017 (CN) .......................... 2017 1 0669334

(51) Int. Cl.
*G09G 3/36* (2006.01)
*G02F 1/1362* (2006.01)
*G09G 3/20* (2006.01)
*G02F 1/1333* (2006.01)
*G02F 1/13357* (2006.01)
(Continued)

(52) U.S. Cl.
CPC .. *G02F 1/136286* (2013.01); *G02F 1/133305* (2013.01); *G02F 1/133606* (2013.01); *G02F 1/134309* (2013.01); *G09G 3/20* (2013.01); *G09G 3/3225* (2013.01); *H01L 27/3276* (2013.01); *G02F 1/1345* (2013.01); *G09G 3/3659* (2013.01); *G09G 2320/0223* (2013.01); *G09G 2320/0242* (2013.01)

(58) Field of Classification Search
CPC ........................... G09G 3/3685; G09G 3/3688
See application file for complete search history.

(56) References Cited

U.S. PATENT DOCUMENTS

2002/0158859 A1* 10/2002 Nakano .................... G09G 3/20
345/204
2018/0240424 A1* 8/2018 Aoki .................... G09G 3/3688

* cited by examiner

*Primary Examiner* — Roy P Rabindranath
(74) *Attorney, Agent, or Firm* — WPAT, PC

(57) ABSTRACT

A display panel and a display device are provided. The display panel includes a substrate, the substrate is provided with a display region, a fan-out region, and a plurality of driving chips, a plurality of signal lines formed in the display region; a plurality of pixel regions formed in the display region, and coupled to the signal lines; a plurality of fan-out wires formed in the fan-out region, wherein one terminal of each of the fan-out wires is connected to the signal lines, the other terminal of each of the fan-out wires is connected to the driving chips; a connecting portion formed in the fan-out region; a plurality of connecting lines formed in the connecting portion, wherein each of the driving chips is connected by the connecting lines; wherein the plurality of the fan-out wires are arranged corresponding to a disposing position of the connecting portion.

14 Claims, 3 Drawing Sheets

(51) Int. Cl.
*G02F 1/1343* (2006.01)
*G09G 3/3225* (2016.01)
*H01L 27/32* (2006.01)
*G02F 1/1345* (2006.01)

DISPLAY PANEL AND DISPLAY DEVICE WITH CONNECTING PORTION FORMED IN FAN-OUT REGION

FIELD OF THE DISCLOSURE

The disclosure relates to a display technical field, and more particularly to a display panel and a display device.

BACKGROUND

The existing display devices are generally controlled by the active switch, with numerous advantages such as thin bodies, energy saving, radiation-free, etc., and have been widely used. It mainly includes displays such as, liquid crystal display, OLED (organic light emitting diode) display, QLED (quantum dot light emitting diodes) Display, plasma display, etc., From the appearance of view, it has both flat-type display, but also curve surface-type display.

For the liquid crystal display, including two parts of the LCD panel and backlight module. The working principle of the liquid crystal display is placing liquid crystal molecules in two parallel glass substrates, and applying driving voltage to the two glass substrates to control the direction of rotation of the liquid crystal molecules, to reflect the light from the backlight module to produce an image.

For OLED displays, the display is performed by using the self-luminous of the organic light-emitting diodes, with the advantages of self-luminous, wide viewing angle, almost infinite high contrast, low power consumption, high response speed and so on.

The structures of the QLED display and OLED technology are very similar, the main difference is that the luminous center of QLED is formed by the Quantum dots material composition. Its structure is that both electrons and holes converge in the quantum dot layer to form excitons, and are recombined by excitons for emission.

However, the resistance of each line in the fan-out region are not necessarily equal because of space and other reasons, and sometimes the difference between the maximum and minimum is too large, resulting in the image display is not smooth enough, especially in the mixed color image, the resistance of the outermost fan-out wire of each driving chip is too large, RC delay is serious, the charging rate of the latter pixel is greater than the charging rate of the previous pixel, the color shift phenomenon is appeared on both sides of the driving chip, affecting the display performance, reduce the user's visual experience.

SUMMARY

An object of the present application is to provide a display panel to improve display quality.

In order to solve the above-mentioned problems, the present application provides a display panel including:

A substrate including a display region, a fan-out region, and a plurality of driving chips;

A plurality of signal lines formed in the display region;

A plurality of pixel regions formed in the display region, and coupled to the signal lines;

A plurality of fan-out wires formed in the fan-out region, wherein one terminal of each of the fan-out wires is connected to the signal lines, the other terminal of each of the fan-out wires is connected to the driving chips;

A connecting portion formed in the fan-out region;

A plurality of connecting lines formed in the connecting portion, wherein each of the driving chips is connected by the connecting lines.

Wherein the plurality of the fan-out wires are arranged corresponding to a disposing position of the connecting portion.

Wherein the driving chips include first source electrode driving chips and second source electrode driving chips.

The fan-out region includes a first fan-out region and a second fan-out region, the first fan-out region including a plurality of first fan-out wires connected to the first source electrode driving chips, the second fan-out region including a plurality of second fan-out wires connected to the second source electrode driving chips.

The connecting portion including a first connecting portion formed in the first fan-out region, and a second connecting portion formed in the second fan-out region, wherein the first source electrode driving chips and the second source electrode driving chips are connected by the connecting lines in the first connecting portion and the second connecting portion.

The first connecting portion disposed in a side of the first fan-out region close to the second fan-out region, the plurality of first fan-out wires arranged corresponding to the position of the first connecting portion.

The second connecting portion disposed in a side of the second fan-out region close to the first fan-out region, the plurality of second fan-out wires arranged corresponding to the position of the second connecting portion. Here is an arrangement type of the two connecting portion disposed between the two source electrode driving chips in the fan-out region. The equal electrical impedance is pulled up in the case of insufficient space, reduce the difference of the resistance between the fan-out wires, improve or even eliminate color shift, increase the display quality. The first connecting portion is disposed in the side of the first fan-out region close to the second fan-out region, the second connecting portion is disposed in the side of the second fan-out region close to the first fan-out region, so that the workload of the layout arrangement of the connecting wires can be effectively reduced, cost savings.

Wherein the driving chips includes first source electrode driving chips and second source electrode driving chips.

The fan-out region includes a first fan-out region and a second fan-out region, the first fan-out region including a plurality of first fan-out wires connected to the first source electrode driving chips, the second fan-out region including a plurality of second fan-out wires connected to the second source electrode driving chips.

The connecting portion includes a first connecting portion formed in the first fan-out region, and a second connecting portion formed in the second fan-out region, wherein the first source electrode driving chips and the second source electrode driving chips are connected by the connecting lines in the first connecting portion and the second connecting portion.

The first connecting portion disposed at an intermediate position of the first fan-out region, the plurality of first fan-out wires arranged corresponding to the position of the first connecting portion.

The second connecting portion disposed at an intermediate position of the second fan-out region, the plurality of second fan-out wires arranged corresponding to the position of the second connecting portion. Here is an arrangement type of the two connecting portion disposed between the two source electrode driving chips in the fan-out region. The equal electrical impedance is pulled up in the case of insufficient space, reduce the difference of the resistance between the fan-out wires, improve or even eliminate color shift, increase the display quality. The first connecting portion is disposed at the intermediate position of the first fan-out region, the second connecting portion is disposed at the intermediate position of the second fan-out region, by the setting in the fan-out region, the maximum and minimum differences of the impedance of the fan-out wires in the fan-out region can be reduced as much as possible, and the entire structure is balanced.

Wherein the driving chips includes source electrode driving chips and gate electrode driving chips, wherein the source electrode driving chips and the gate electrode driving chips are connected by the connecting lines in the connecting portion.

The fan-out wires are connected to the source electrode driving chips;

The connecting portion disposed in a side of the fan-out region close to the gate electrode driving chips, wherein the plurality of fan-out wires is arranged corresponding to the position of the connecting portion. Here is an arrangement type of the connecting portion disposed between the source electrode and the gate electrode driving chips in the fan-out region. The equal electrical impedance is pulled up in the case of fixed space and number of the driving chips, reduce the difference of the resistance between the fan-out wires, improve or even eliminate color shift, increase the display quality. The connecting portion disposed in a side of the fan-out region close to the gate electrode driving chip, so that the workload of the layout arrangement of the connecting wires can be effectively reduced, cost savings.

Wherein the driving chips includes source electrode driving chips and gate electrode driving chips, wherein the source electrode driving chips and the gate electrode driving chips are connected by the connecting lines in the connecting portion.

The fan-out wires are connected to the source electrode driving chips.

The connecting portion disposed at an intermediate position of the fan-out region, wherein the plurality of fan-out wires are arranged correspondingly to the position of a first terminal. Here is an arrangement type of the connecting portion disposed between the source electrode and the gate electrode driving chips in the fan-out region. The equal electrical impedance is pulled up in the case of fixed space and number of the driving chips, reduce the difference of the resistance between the fan-out wires, improve or even eliminate color shift, increase the display quality. The connecting portion disposed at an intermediate position of the fan-out region, so that the workload of the layout arrangement of the connecting wires can be effectively reduced, cost savings.

Wherein the driving chips includes first source electrode driving chips, second source electrode driving chips, first gate electrode driving chips and second gate electrode driving chips, wherein the first source electrode driving chips and the second source electrode driving chips are disposed adjacent to each other in the same side of a first edge of the display area, and the first gate electrode driving chips and the second gate electrode driving chips are disposed in both sides of the first edge, respectively.

The fan-out region includes a first fan-out region and a second fan-out region, the first fan-out region including a plurality of first fan-out wires connected to the first source electrode driving chips, the second fan-out region including a plurality of second fan-out wires connected to the second source electrode driving chips.

The connecting portion includes a first connecting portion and a second connecting portion formed in the first fan-out region, and a third connecting portion and a fourth connecting portion formed in the second fan-out region, wherein the first source electrode driving chips and the second source electrode driving chips are connected by the connecting lines in the first connecting portion and the third connecting portion, the first source electrode driving chips and the first gate electrode driving chips are connected by the connecting lines in the second connecting portion, the second source electrode driving chips and the second gate electrode driving chips are connected by the connecting lines in the fourth connecting portion.

The first connecting portion and the third connecting portion disposed at an intermediate position of the first fan-out region, the plurality of first fan-out wires arranged corresponding to the position of the first connecting portion and the third connecting portion.

The second connecting portion and the fourth connecting portion disposed at an intermediate position of the second fan-out region, wherein the plurality of second fan-out wires are arranged corresponding to the position of the second connecting portion and the fourth connecting portion. Here is the connecting portion between the two source electrode driving chips is provided an intermediate position of the fan-out region and the connecting portion between the source electrode and the gate electrode driving chips is provided an intermediate position of the fan-out region.

Wherein the driving chips includes source electrode driving chips, first gate electrode driving chips and second gate electrode driving chips, and the first gate electrode driving chips and the second gate electrode driving chips are disposed in both sides of the source electrode driving chips, respectively;

The fan-out wires are connected to the source electrode driving chips.

The connecting portion including a first connecting portion and a second connecting portion formed in the fan-out region, wherein the source electrode driving chips and the first gate electrode driving chips are connected by the connecting lines in the first connecting portion; the source electrode driving chips and the second gate electrode driving chips are connected by the connecting lines in the second connecting portion.

The first connecting portion and the second connecting portion disposed at an intermediate position of the fan-out region, wherein the plurality of fan-out wires are arranged corresponding to the position of the first connecting portion and the second connecting portion. Here is the connecting portion between the source and the two gate electrode driving chips an intermediate position of the fan-out region.

Wherein the connecting lines includes an array substrate trace and a common electrode trace of a color filter substrate, and the connecting portion includes a transfer portion. Here is the specific arrangement of the connecting portion.

Another object of the present application is to provide a display device.

A display device includes a controller, and the display panel of the disclosure.

Another objective of the disclosure is to provide a display panel.

The display panel includes:

A substrate including a display region, a fan-out region, and a plurality of driving chips;

A plurality of signal lines formed in the display region;

A plurality of pixel regions formed in the display region, and coupled to the signal lines;

A plurality of fan-out wires formed in the fan-out region, wherein one terminal of each of the fan-out wires is connected to the signal lines, the other terminal of each of the fan-out wires is connected to the driving chips;

A connecting portion formed in the fan-out region;

A plurality of connecting lines formed in the connecting portion, wherein each of the driving chips is connected by the connecting lines.

Wherein the plurality of the fan-out wires is arranged corresponding to a disposing position of the connecting portion.

Wherein the driving chips includes first source electrode driving chips and second source electrode driving chips, the fan-out region including a first fan-out region and a second fan-out region, the first fan-out region including a plurality of first fan-out wires connected to the first source electrode driving chips, the second fan-out region including a plurality of second fan-out wires connected to the second source electrode driving chips, the connecting portion including a first connecting portion formed in the first fan-out region, and a second connecting portion formed in the second fan-out region, wherein the first source electrode driving chips and the second source electrode driving chips are connected by the connecting lines in the first connecting portion and the second connecting portion, the first connecting portion disposed in a side of the first fan-out region close to the second fan-out region, the plurality of first fan-out wires are arranged corresponding to the position of the first connecting portion, the second connecting portion disposed in a side of the second fan-out region close to the first fan-out region, the plurality of second fan-out wires are arranged correspondingly to the position of the second connecting portion.

Or wherein the driving chips include first source electrode driving chips, second source electrode driving chips, first gate electrode driving chips and second gate electrode driving chips, wherein the first source electrode driving chips and the second source electrode driving chips are disposed adjacent to each other in the same side of a first edge of the display area, and the first gate electrode driving chips and the second gate electrode driving chips are disposed in both sides of the first edge, respectively; the fan-out region including a first fan-out region and a second fan-out region, the first fan-out region including a plurality of first fan-out wires connected to the first source electrode driving chips, the second fan-out region including a plurality of second fan-out wires connected to the second source electrode driving chips; the connecting portion including a first connecting portion and a second connecting portion formed in the first fan-out region, and a third connecting portion and a fourth connecting portion formed in the second fan-out region, wherein the first source electrode driving chips and the second source electrode driving chips are connected by the connecting lines in the first connecting portion and the third connecting portion, the first source electrode driving chips and the first gate electrode driving chips are connected by the connecting lines in the second connecting portion, the second source electrode driving chips and the second gate electrode driving chips are connected by the connecting lines in the fourth connecting portion; the first connecting portion and the third connecting portion disposed at an intermediate position of the first fan-out region, wherein the plurality of first fan-out wires are arranged corresponding to the position of the first connecting portion and the third connecting portion; and the second connecting portion and the fourth connecting portion disposed at an intermediate position of the second fan-out region, wherein the plurality of second fan-out wires are arranged corresponding to the position of the second connecting portion and the fourth connecting portion.

Or wherein the driving chips includes source electrode driving chips, first gate electrode driving chips and second gate electrode driving chips, and the first gate electrode driving chips and the second gate electrode driving chips are disposed in both sides of the source electrode driving chips, respectively; the fan-out wires connected to the source electrode driving chips; the connecting portion including a first connecting portion and a second connecting portion formed in the fan-out region, wherein the source electrode driving chips and the first gate electrode driving chips are connected by the connecting lines in the first connecting portion, the source electrode driving chips and the second gate electrode driving chips are connected by the connecting lines in the second connecting portion; and the first connecting portion and the second connecting portion disposed at an intermediate position of the fan-out region, wherein the plurality of fan-out wires are arranged corresponding to the position of the first connecting portion and the second connecting portion.

In this application, since the connecting portion for communicating the driving chip is provided in the fan-out region so that the fan-out wires in the fan-out region are arranged in a limited space, the layout space is appropriately optimized, and reduces the difference of the resistance between the fan-out wires, improve or even eliminate color shift, increase the display quality.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the FIGS..

DETAILED DESCRIPTION OF PREFERRED EMBODIMENTS

Figure 1:
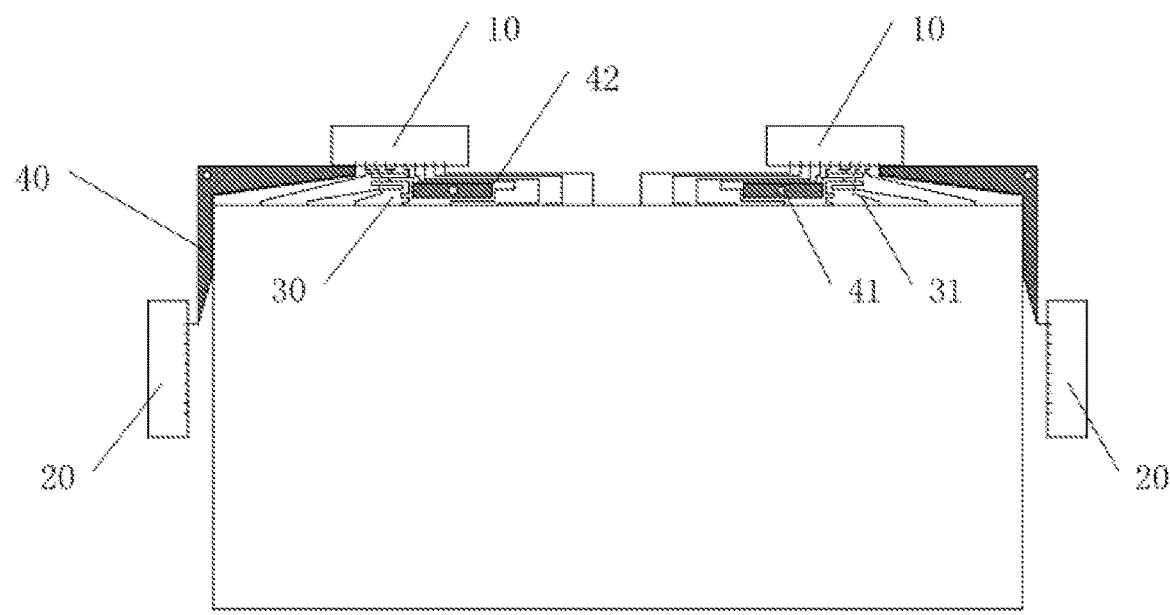
FIG. 1 is a structural schematic view of a connecting portion between source electrode driving chips of a display panel disposed in a fan-out region according to an embodiment of the present invention.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The display panel and the display device of the present application will be described in further detail below with reference to the embodiments of FIGS. 1 to 6.

As an embodiment of the present application, as shown in FIGS. 1 to 6, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

As an embodiment of the present application, as shown in FIG. 1, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes first source electrode driving chips and second source electrode driving chips. The fan-out region includes a first fan-out region and a second fan-out region, the first fan-out region includes a plurality of first fan-out wires connected to the first source electrode driving chip, the second fan-out region includes a plurality of second fan-out wires connected to the second source electrode driving chip; the connecting portion includes a first connecting portion formed in the first fan-out region, and a second connecting portion formed in the second fan-out region. The first source electrode driving chips and the second source electrode driving chips are connected by the connecting lines in the first connecting portion and the second connecting portion; the first connecting portion is disposed in a side of the first fan-out region close to the second fan-out region, the plurality of first fan-out wires are arranged corresponding to the position of the first connecting portion; the second connecting portion is disposed in a side of the second fan-out region close to the first fan-out region, the plurality of second fan-out wires are arranged corresponding to the position of the second connecting portion. The equal electrical impedance is pulled up in the case of insufficient space, reduce the difference of the resistance between the fan-out wires, improve or even eliminate color shift, increase the display quality. The first connecting portion is disposed in the side of the first fan-out region close to the second fan-out region, the second connecting portion is disposed in the side of the second fan-out region close to the first fan-out region, so that the workload of the layout arrangement of the connecting wires can be effectively reduced, cost savings. As shown in FIG. 1, the two source electrode driving chips 10 employ a chip on film, the two gate electrode driving chips 20 employ a chip on film, the source electrode driving chips 10 are connected to the display region by the plurality of fan-out wires 31 in the corresponding fan-out region 30, the two of the source electrode driving chips 10 are connected to each other by connecting lines 40, the connecting lines 40 may be provided with a wire on array, WOA, a connecting portion 42 is disposed in part of the fan-out region corresponding to the related driving chip a fan-out region 30, a transfer portion 41 is disposed in the connecting portion 42.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting line includes an array substrate trace and a common electrode trace of the color filter substrate, a transfer portion is disposed in the connecting portion.

Figure 2:
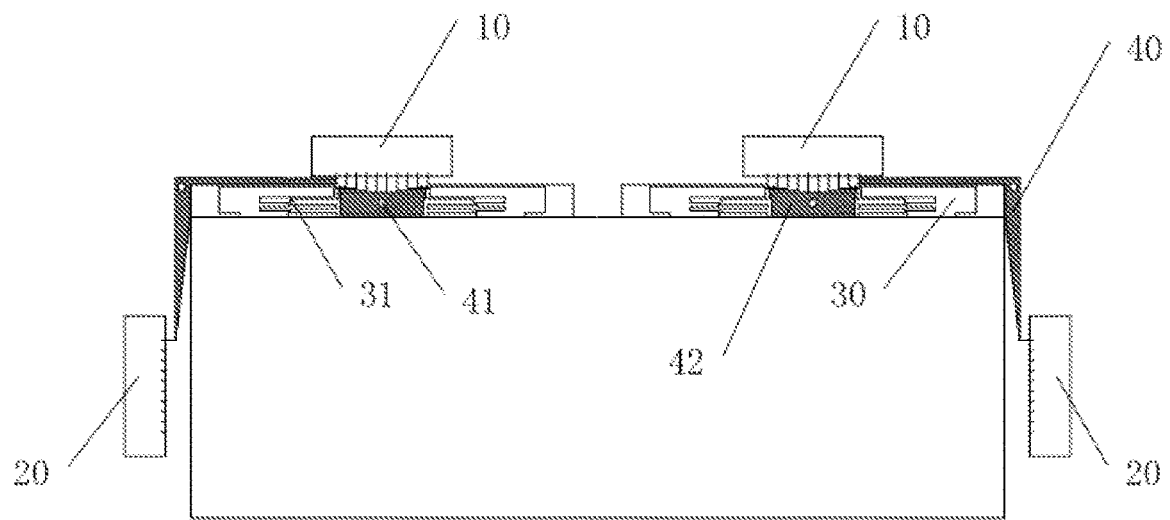
FIG. 2 is a structural schematic view of a connecting portion between two source electrode driving chips of the display panel disposed in the fan-out region according to an embodiment of the present invention.

As a further embodiment of the present application, as shown in FIG. 2, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes first source electrode driving chips and second source electrode driving chips. The fan-out region includes a first fan-out region and a second fan-out region, the first fan-out region includes a plurality of first fan-out wires connected to the first source electrode driving chip, the second fan-out region includes a plurality of second fan-out wires connected to the second source electrode driving chip; the connecting portion includes a first connecting portion formed in the first fan-out region, and a second connecting portion formed in the second fan-out region. The first source electrode driving chips and the second source electrode driving chips are connected by the connecting lines in the first connecting portion and the second connecting portion; the first connecting portion is disposed at an intermediate position of the first fan-out region, the plurality of first fan-out wires are arranged corresponding to the position of the first connecting portion; the second connecting portion is disposed at an intermediate position of the second fan-out region, the plurality of second fan-out wires are arranged corresponding to the position of the second connecting portion. The equal electrical impedance is pulled up in the case of insufficient space, reduce the difference of the resistance between the fan-out wires, improve or even eliminate color shift, increase the display quality. The first connecting portion is disposed at the intermediate position of the first fan-out region, the second connecting portion is disposed at the intermediate position of the second fan-out region, by the setting in the fan-out region, the maximum and minimum differences of the impedance of the fan-out wires in the fan-out region can be reduced as much as possible, and the entire structure is balanced. As shown in FIG. 2, the two source electrode driving chips 10 employ a chip on film, the two gate electrode driving chips 20 employ a chip on film, the source electrode driving chips 10 are connected to the display region by the plurality of fan-out wires 31 in the corresponding fan-out region 30, the two of the source electrode driving chips 10 are connected to each other by connecting lines 40, the connecting lines 40 may be provided with a wire on array, WOA, a connecting portion 42 is disposed at the intermediate position of the fan-out region 30, a transfer portion 41 is disposed in the connecting portion 42.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting lines include an array substrate trace and a common electrode trace of a color filter substrate, and the connecting portion includes a transfer portion.

As an embodiment of the present application, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes a source electrode driving chip and a gate electrode driving chip, the source electrode driving chip and the gate electrode driving chip are connected by the connecting lines in the connecting portion; the fan-out wires are connected to the source electrode driving chip; the connecting portion is disposed on a side of the fan-out region close to the gate electrode driving chip, the plurality of fan-out wires are arranged corresponding to the position of the connecting portion. The equal electrical impedance is pulled up in the case of fixed space and number of the driving chips, reduce the difference of the resistance between the fan-out wires, improve or even eliminate color shift, increase the display quality. The first connecting portion is disposed in the side of the first fan-out region close to the second fan-out region, the second connecting portion is disposed in the side of the second fan-out region close to the first fan-out region, so that the workload of the layout arrangement of the connecting wires can be effectively reduced, cost savings.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting line includes an array substrate trace and a common electrode trace of the color filter substrate, a transfer portion is disposed in the connecting portion.

Figure 3:
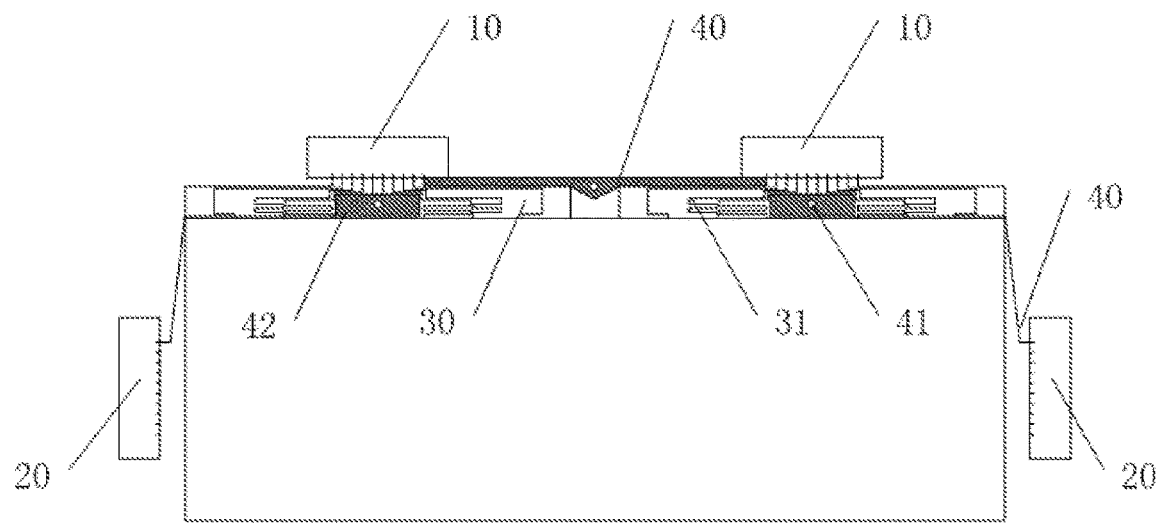
FIG. 3 is a structural schematic view of a connecting portion between the source electrode and a gate electrode driving chip of the display panel disposed in the fan-out region according to an embodiment of the present invention.

As a further embodiment of the present application, as shown in FIG. 3, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes a source electrode driving chip and a gate electrode driving chip, the source electrode driving chip and the gate electrode driving chip are connected by the connecting lines in the connecting portion; the fan-out wires are connected to the source electrode driving chip; the connecting portion is disposed at the intermediate position of the fan-out region, the plurality of fan-out wires are arranged corresponding to the position of the connecting portion. The equal electrical impedance is pulled up in the case of the space and the number of the driving ship is fixed, the difference of the resistance between the fan-out wires is reduced, improve or even eliminate color shift, increase the display quality. The connecting portion is disposed in the canter of the first fan-out region, the maximum and minimum differences of the impedance of the fan-out wires in the fan-out region can be reduced as much as possible, and the entire structure is balanced. As shown in FIG. 3, the two source electrode driving chips 10 employ a chip on film, the two gate electrode driving chips 20 employ a chip on film, the source electrode driving chips 10 are connected to the display region by the plurality of fan-out wires 31 in the corresponding fan-out region 30, the two of the source electrode driving chips 10 are connected to each other by connecting lines 40, the connecting lines 40 may be provided with CF_com (a common electrode trace of the color filter substrate), the connecting portion 42 is disposed at the intermediate position of the fan-out region 30, the transfer portion 41 is disposed in the connecting portion 42.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting line includes an array substrate trace and a common electrode trace of the color filter substrate, a transfer portion is disposed in the connecting portion.

Figure 4:
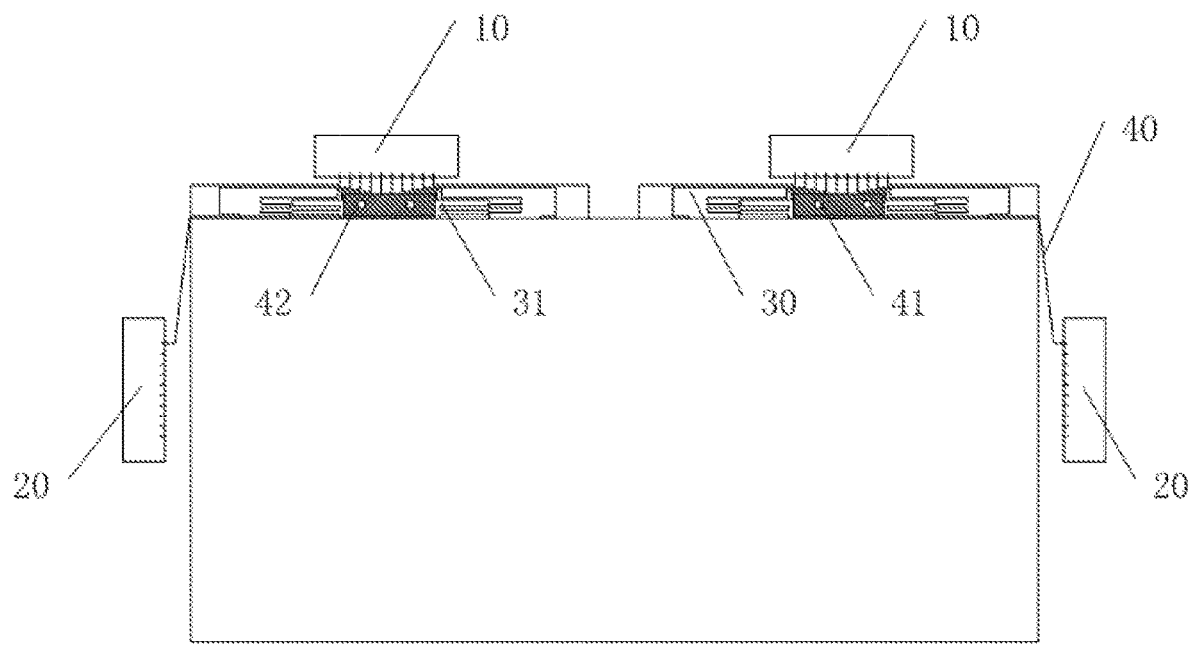
FIG. 4 is a structural schematic view of a connecting portion between the two source electrode driving chips disposed in the fan-out region and a connecting portion between the source electrode and the gate electrode driving chips of the display panel of the display panel disposed in the fan-out region according to an embodiment of the present invention.

As a further embodiment of the present application, as shown in FIG. 4, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion.

Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes a first source electrode driving chip, a second source electrode driving chip, first gate electrode driving chips and second gate electrode driving chips, the first source electrode driving chips and the second source electrode driving chips are disposed adjacent to each other in the same side of the display area and referred to a first edge, the first gate electrode driving chips and the second gate electrode driving chips are disposed in both sides of the first edge, respectively; the fan-out region includes a first fan-out region and a second fan-out region, the first fan-out region includes a plurality of first fan-out wires connected to the first source electrode driving chip, the second fan-out region includes a plurality of second fan-out wires connected to the second source electrode driving chip; the connecting portion includes a first connecting portion and a second connecting portion formed in the first fan-out region, and a third connecting portion and a fourth connecting portion formed in the second fan-out region. The first source electrode driving chips and the second source electrode driving chips are connected by the connecting lines in the first connecting portion and the third connecting portion; the first source electrode driving chip and the first gate electrode driving chip are connected by the connecting lines in the second connecting portion, the second source electrode driving chip and the second gate electrode driving chip are connected by the connecting lines in the fourth connecting portion; the first connecting portion and the third connecting portion are disposed at an intermediate position of the first fan-out region, the plurality of first fan-out wires are arranged corresponding to the position of the first connecting portion and the third connecting portion; the second connecting portion and the fourth connecting portion are disposed at an intermediate position of the second fan-out region, the plurality of second fan-out wires are arranged corresponding to the position of the second connecting portion and the fourth connecting portion. The embodiment specific shown the connecting portions between the two source electrode driving chips disposed at the intermediate position of the fan-out region, and the connecting portions between the source electrode driving chip and the gate electrode driving chip disposed at the intermediate position of the fan-out region. As shown in FIG. 4, the two source electrode driving chips 10 employ a chip on film, the two gate electrode driving chips 20 employ a chip on film, the source electrode driving chips 10 are connected to the display region by the plurality of fan-out wires 31 in the corresponding fan-out region 30, the two of the source electrode driving chips 10 are connected to each other by connecting lines 40, the connecting lines 40 may be provided with CF_com (common electrode trace of the color filter substrate), the two source electrode driving chips 10 are connected by the connection line 40, the connection line 40 may be provided with WOA (wire on array), a connecting portion 42 between the, and two sources The connecting portions 42 between the source and the gate electrode driving chips and the connecting portions 42 between the two source electrode driving chips are both provided at the intermediate position in the fan-out region 30, and both of the connecting portions 42 are provided with transfer portions 41.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting line includes an array substrate trace and a common electrode trace of the color filter substrate, a transfer portion is disposed in the connecting portion.

Figure 5:
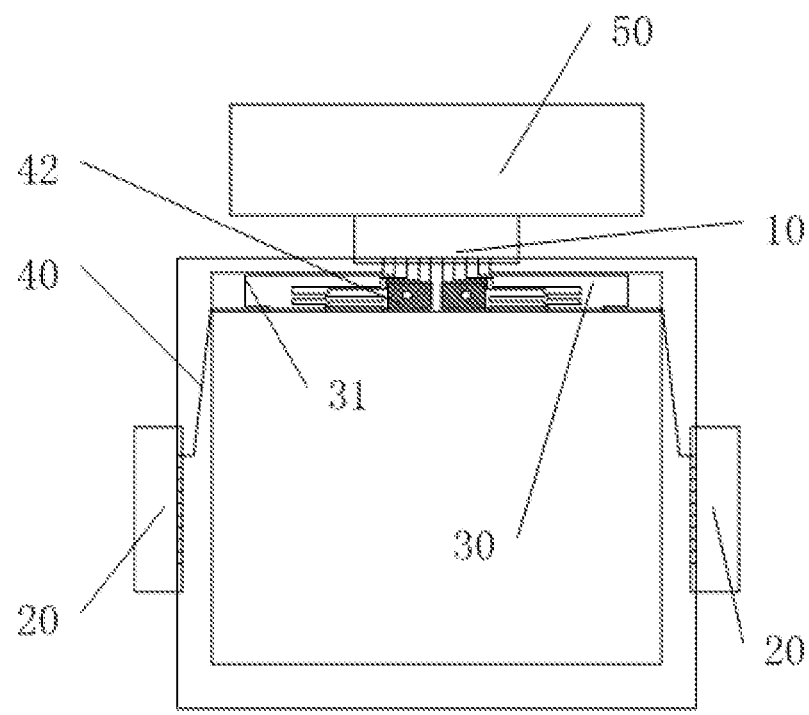
FIG. 5 is a structural schematic view of a connecting portion between the source electrode and the two gate electrode driving chips of the display panel disposed in the fan-out region according to an embodiment of the present invention.
Figure 6:
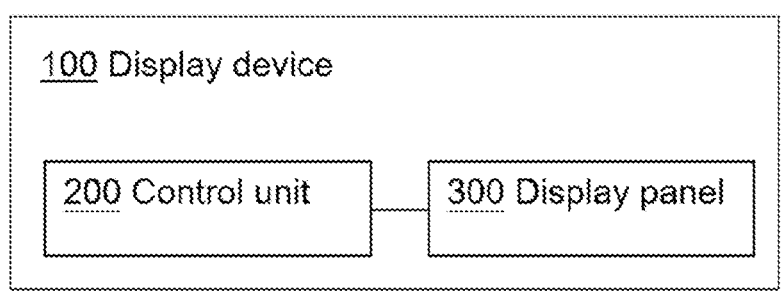
FIG. 6 is a structural schematic view of a display device according to an embodiment of the present application.

As a further embodiment of the present application, as shown in FIG. 5, the display panel includes: a substrate, the substrate is provided with a display region, a fan-out region, and a plurality of driving chips, a plurality of signal lines formed in the display region; A plurality of pixel regions formed in the display region, and coupled to the signal lines; a plurality of fan-out wires formed in the fan-out region, one terminal of the fan-out wires are connected to the signal lines, the other terminals of the fan-out wires are connected to the driving chips; a connecting portion is formed in the fan-out region; a plurality of connecting lines are formed in the connecting portion, and the driving chips are connected by the connecting lines; wherein a plurality of the fan-out wires are arranged corresponding to a disposing position of the connecting portion. Since the connecting portion for communicating the driving chip is disposed in the fan-out region, so that the fan-out wires in the fan-out region are corresponding arranged in a limited space, for a reasonable arrangement to optimize the spatial layout, to reduce the resistance differences between the fan-out wires, improve or even eliminate the color shift, improve the display quality.

Wherein the driving chip includes a source electrode driving chip, a first gate electrode driving chip and a second gate electrode driving chip, the first gate electrode driving chips and the second gate electrode driving chips are disposed in both sides of the source electrode driving chip, respectively; the fan-out wires are connected to the source electrode driving chip; the connecting portion includes a first connecting portion and a second connecting portion formed in the fan-out region, the source electrode driving chip and the first gate electrode driving chip are connected by the connecting lines in the first connecting portion; the source electrode driving chip and the second gate electrode driving chip are connected by the connecting lines in the second connecting portion; the first connecting portion and the second connecting portion are disposed at an intermediate position of the fan-out region, the plurality of fan-out wires are arranged corresponding to the position of the first connecting portion and the second connecting portion; As shown in FIG. 5, the source electrode driving chip 10 employ a chip on film, the two gate electrode driving chips 20 employ a chip on film, the source electrode driving chip 10 is connected to the display region by the plurality of fan-out wires 31 in the corresponding fan-out region 30, the source electrode driving chip 10 is connected to a printed circuit board assembly PCBA disposed above, the source electrode driving chip 10 is connected to the gate electrode driving chips 20 in the both sides by the connection line 40, respectively; the connection line 40 may be provided with the CF_com trace (color film substrate common electrode trace), a signal is transmitted by the fan-out wire 31 to the inside, the CF_com trace is the trace connecting the source electrode driving chip 10 and the gate electrode driving chips 20, the function of the CF_com trace is transmitting the signal from a side of the source electrode driving chip 10 to a side of the gate electrode driving chips 20, two sets of connecting portions 42 between the source electrode driving chip and the gate electrode driving chips are also provided at the intermediate positions of the fan-out region 30, both of the connecting portions 42 are provided with transfer portions 41.

Specifically, the driving chip uses the COF technique (Chip On Flex, or Chip On Film), i.e., the technology of bonding a chip to a flexible substrate circuit using a flexible additional circuit board as the chip carrier for packaging or referred to a single flexible additional circuit board not package with the chip. With the advantages of high density, small size, and free packaging.

Specifically, the connecting line includes an array substrate trace and a common electrode trace of the color filter substrate, a transfer portion is disposed in the connecting portion.

In the above embodiment, the display panel includes a liquid crystal panel, an Organic Light-Emitting Diode, OLED panel, a Quantum Dot Light Emitting Diodes, QLED panel, a plasma panel, a planar-type panel, a curved-type panel, and the like.

Referring to FIG. 7, the present embodiment discloses a display device 100. The display device 100 includes a control unit 200 and a display panel 300 described in the present application. The above is taken the display panel as the detail description, it is also applicable to that, and the above description of the display panel structure is also applicable to the display device of the embodiment of the present application. Wherein when the display device of the embodiment of the present application is a liquid crystal display, the liquid crystal display includes a backlight module, the backlight module can be used as a light source for supplying a light source with sufficient brightness and uniform distribution, and the backlight module of the present embodiment may be either a front light type or a backlight type. It should be noted that the backlight module of the present embodiment is not limited thereto.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:
1. A display panel comprising:
   a substrate comprising a display region, a fan-out region, and a plurality of driving chips;
   a plurality of signal lines formed in the display region;
   a plurality of pixel regions formed in the display region, and coupled to the signal lines;

a plurality of fan-out wires formed in the fan-out region, wherein one terminal of each of the fan-out wires is connected to the signal lines, the other terminal of each of the fan-out wires is connected to the driving chips;
a connecting portion formed in the fan-out region;
a plurality of connecting lines formed in the connecting portion, wherein each of the driving chips is connected by the connecting lines;
wherein the plurality of the fan-out wires is arranged corresponding to a disposing position of the connecting portion;
wherein the connecting lines comprise an array substrate trace and a common electrode trace of a color filter substrate, and the connecting portion comprises a transfer portion.

2. The display panel according to claim 1, wherein the driving chips comprises first source electrode driving chips and second source electrode driving chips;
the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips;
the connecting portion comprising a first connecting portion formed in the first fan-out region, and a second connecting portion formed in the second fan-out region, wherein the first source electrode driving chips and the second source electrode driving chips are connected by the connecting lines in the first connecting portion and the second connecting portion respectively;
the first connecting portion disposed at an intermediate position of the first fan-out region, the plurality of first fan-out wires arranged corresponding to the position of the first connecting portion; and
the second connecting portion disposed at an intermediate position of the second fan-out region, the plurality of second fan-out wires arranged corresponding to the position of the second connecting portion.

3. The display panel according to claim 2, wherein the driving chips further comprises source electrode driving chips and gate electrode driving chips, wherein the source electrode driving chips and the gate electrode driving chips are connected by the connecting lines in the connecting portion;
the fan-out wires connected to the source electrode driving chips; and
the connecting portion disposed in a side of the fan-out region close to the gate electrode driving chips, wherein the plurality of fan-out wires are arranged corresponding to the position of the connecting portion.

4. The display panel according to claim 2, wherein the driving chips further comprises source electrode driving chips and gate electrode driving chips, the source electrode driving chips and the gate electrode driving chips are connected by the connecting lines in the connecting portion;
the fan-out wires connected to the source electrode driving chips; and
the connecting portion disposed at an intermediate position of the fan-out region, wherein the plurality of fan-out wires are arranged corresponding to the position of a first terminal.

5. The display panel according to claim 1, wherein the driving chips comprises source electrode driving chips and gate electrode driving chips, wherein the source electrode driving chips and the gate electrode driving chips are connected by the connecting lines in the connecting portion;
the fan-out wires connected to the source electrode driving chips; and
the connecting portion disposed in a side of the fan-out region close to the gate electrode driving chips, wherein the plurality of fan-out wires are arranged corresponding to the position of the connecting portion.

6. The display panel according to claim 1, wherein the driving chips comprises source electrode driving chips and gate electrode driving chips, the source electrode driving chips and the gate electrode driving chips are connected by the connecting lines in the connecting portion;
the fan-out wires connected to the source electrode driving chips; and
the connecting portion disposed at an intermediate position of the fan-out region, wherein the plurality of fan-out wires is arranged corresponding to the position of a first terminal.

7. The display panel according to claim 1, wherein the driving chips comprises first source electrode driving chips, second source electrode driving chips, first gate electrode driving chips and second gate electrode driving chips, wherein the first source electrode driving chips and the second source electrode driving chips are disposed adjacent to each other in the same side of a first edge of the display area, and the first gate electrode driving chips and the second gate electrode driving chips are disposed in both sides of the first edge, respectively;
the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips;
the connecting portion comprising a first connecting portion and a second connecting portion formed in the first fan-out region, and a third connecting portion and a fourth connecting portion formed in the second fan-out region, wherein the first source electrode driving chips and the second source electrode driving chips are connected by the connecting lines in the first connecting portion and the third connecting portion, the first source electrode driving chips and the first gate electrode driving chips are connected by the connecting lines in the second connecting portion, the second source electrode driving chips and the second gate electrode driving chips are connected by the connecting lines in the fourth connecting portion;
the first connecting portion and the third connecting portion disposed at an intermediate position of the first fan-out region, the plurality of first fan-out wires arranged corresponding to the position of the first connecting portion and the third connecting portion; and
the second connecting portion and the fourth connecting portion disposed at an intermediate position of the second fan-out region, wherein the plurality of second fan-out wires are arranged corresponding to the position of the second connecting portion and the fourth connecting portion.

8. The display panel according to claim 1, wherein the driving chips comprises source electrode driving chips, first gate electrode driving chips and second gate electrode driving chips, and the first gate electrode driving chips and the second gate electrode driving chips are disposed in both sides of the source electrode driving chips, respectively;

the fan-out wires connected to the source electrode driving chips;

the connecting portion comprising a first connecting portion and a second connecting portion formed in the fan-out region, wherein the source electrode driving chips and the first gate electrode driving chips are connected by the connecting lines in the first connecting portion; the source electrode driving chips and the second gate electrode driving chips are connected by the connecting lines in the second connecting portion; and the first connecting portion and the second connecting portion disposed at an intermediate position of the fan-out region, wherein the plurality of fan-out wires is arranged corresponding to the position of the first connecting portion and the second connecting portion.

9. A display panel comprising:

a substrate comprising a display region, a fan-out region, and a plurality of driving chips;

a plurality of signal lines formed in the display region;

a plurality of pixel regions formed in the display region, and coupled to the signal lines;

a plurality of fan-out wires formed in the fan-out region, wherein one terminal of each of the fan-out wires is connected to the signal lines, the other terminal of each of the fan-out wires is connected to the driving chips;

a connecting portion formed in the fan-out region;

a plurality of connecting lines formed in the connecting portion, wherein each of the driving chips is connected by the connecting lines;

wherein the plurality of the fan-out wires is arranged corresponding to a disposing position of the connecting portion;

wherein the driving chips comprises first source electrode driving chips and second source electrode driving chips, the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips, the connecting portion comprising a first connecting portion formed in the first fan-out region, and a second connecting portion formed in the second fan-out region, wherein the first source electrode driving chips and the second source electrode driving chips are connected by the connecting lines in the first connecting portion and the second connecting portion respectively, the first connecting portion disposed in a side of the first fan-out region close to the second fan-out region, the plurality of first fan-out wires are arranged corresponding to the position of the first connecting portion, the second connecting portion disposed in a side of the second fan-out region close to the first fan-out region, the plurality of second fan-out wires are arranged corresponding to the position of the second connecting portion; and wherein the connecting lines comprises an array substrate trace and a common electrode trace of a color filter substrate, and the connecting portion comprises a transfer portion.

10. A display device comprising:

a control unit; and a display panel, comprising:

a substrate comprising a display region, a fan-out region, and a plurality of driving chips;

a plurality of signal lines formed in the display region;

a plurality of pixel regions formed in the display region, and coupled to the signal lines;

a plurality of fan-out wires formed in the fan-out region, wherein one terminal of each of the fan-out wires is connected to the signal lines, the other terminal of each of the fan-out wires is connected to the driving chips;

a connecting portion formed in the fan-out region;

a plurality of connecting lines formed in the connecting portion, wherein each of the driving chips is connected by the connecting lines;

wherein the plurality of the fan-out wires is arranged corresponding to a disposing position of the connecting portion;

wherein the connecting lines comprises an array substrate trace and a common electrode trace of a color filter substrate, and the connecting portion comprises a transfer portion.

11. The display device according to claim 10, wherein the driving chips comprises first source electrode driving chips and second source electrode driving chips;

the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips;

the connecting portion comprising a first connecting portion formed in the first fan-out region, and a second connecting portion formed in the second fan-out region, wherein the first source electrode driving chips and the second source electrode driving chips are connected by the connecting lines in the first connecting portion and the second connecting portion respectively;

the first connecting portion disposed in a side of the first fan-out region close to the second fan-out region, wherein the plurality of first fan-out wires is arranged corresponding to the position of the first connecting portion; and the second connecting portion disposed in a side of the second fan-out region close to the first fan-out region, wherein the plurality of second fan-out wires are arranged corresponding to the position of the second connecting portion.

12. The display device according to claim 10, wherein the driving chips comprises first source electrode driving chips and second source electrode driving chips;

the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips;

the connecting portion comprising a first connecting portion formed in the first fan-out region, and a second connecting portion formed in the second fan-out region, wherein the first source electrode driving chips and the second source electrode driving chips are connected by the connecting lines in the first connecting portion and the second connecting portion respectively;

the first connecting portion disposed at an intermediate position of the first fan-out region, wherein the plurality of first fan-out wires are arranged corresponding to the position of the first connecting portion; and the second connecting portion disposed at an intermediate position of the second fan-out region, wherein the plurality of second fan-out wires are arranged corresponding to the position of the second connecting portion.

13. The display device according to claim 10, wherein the driving chips comprises first source electrode driving chips, second source electrode driving chips, first gate electrode driving chips and second gate electrode driving chips, wherein the first source electrode driving chips and the second source electrode driving chips are disposed adjacent to each other in the same side of a first edge of the display area, and the first gate electrode driving chips and the second gate electrode driving chips are disposed in both sides of the first edge, respectively;

the fan-out region comprising a first fan-out region and a second fan-out region, the first fan-out region comprising a plurality of first fan-out wires connected to the first source electrode driving chips, the second fan-out region comprising a plurality of second fan-out wires connected to the second source electrode driving chips;

the connecting portion comprising a first connecting portion and a second connecting portion formed in the first fan-out region, and a third connecting portion and a fourth connecting portion formed in the second fan-out region, wherein the first source electrode driving chips and the second source electrode driving chips are connected by the connecting lines in the first connecting portion and the third connecting portion, the first source electrode driving chips and the first gate electrode driving chips are connected by the connecting lines in the second connecting portion, the second source electrode driving chips and the second gate electrode driving chips are connected by the connecting lines in the fourth connecting portion;

the first connecting portion and the third connecting portion disposed at an intermediate position of the first fan-out region, wherein the plurality of first fan-out wires are arranged corresponding to the position of the first connecting portion and the third connecting portion; and the second connecting portion and the fourth connecting portion disposed at an intermediate position of the second fan-out region, wherein the plurality of second fan-out wires are arranged corresponding to the position of the second connecting portion and the fourth connecting portion.

14. The display device according to claim 10, wherein the driving chips comprises source electrode driving chips, first gate electrode driving chips and second gate electrode driving chips, and the first gate electrode driving chips and the second gate electrode driving chips are disposed in both sides of the source electrode driving chips, respectively;

the fan-out wires connected to the source electrode driving chips;

the connecting portion comprising a first connecting portion and a second connecting portion formed in the fan-out region, wherein the source electrode driving chips and the first gate electrode driving chips are connected by the connecting lines in the first connecting portion, the source electrode driving chips and the second gate electrode driving chips are connected by the connecting lines in the second connecting portion; and the first connecting portion and the second connecting portion disposed at an intermediate position of the fan-out region, wherein the plurality of fan-out wires is arranged corresponding to the position of the first connecting portion and the second connecting portion.

* * * * *